United States Patent
Takeyama et al.

(10) Patent No.: US 7,582,571 B2
(45) Date of Patent: Sep. 1, 2009

(54) SUBSTRATE PROCESSING METHOD AND RECORDING MEDIUM

(75) Inventors: Tamaki Takeyama, Nirasaki (JP); Munehisa Futamura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 129 days.

(21) Appl. No.: 11/909,102

(22) PCT Filed: Feb. 21, 2006

(86) PCT No.: PCT/JP2006/303069
§ 371 (c)(1),
(2), (4) Date: Sep. 19, 2007

(87) PCT Pub. No.: WO2006/100862
PCT Pub. Date: Sep. 28, 2006

(65) Prior Publication Data
US 2009/0061643 A1    Mar. 5, 2009

(30) Foreign Application Priority Data
Mar. 22, 2005 (JP) .............................. 2005-081878

(51) Int. Cl.
*H01L 21/42* (2006.01)
*H01L 21/461* (2006.01)
*H01L 21/469* (2006.01)
(52) U.S. Cl. ................. 438/758; 438/513; 438/726; 438/727; 257/E21.269; 257/E21.274
(58) Field of Classification Search .......... 257/E21.269, 257/E21.274
See application file for complete search history.

(56) References Cited

U.S. PATENT DOCUMENTS

| 6,361,707 B1 * | 3/2002 | Tanaka et al. ................ 216/69 |
| 6,532,069 B1 * | 3/2003 | Otsuki et al. ................ 356/338 |

FOREIGN PATENT DOCUMENTS

| JP | 2002 151489 | 5/2002 |
| JP | 2004 6733 | 1/2004 |
| JP | 2004 288900 | 10/2004 |
| JP | 2006 52424 | 2/2006 |
| WO | 2004 040630 | 5/2004 |

\* cited by examiner

*Primary Examiner*—Charles D. Garber
*Assistant Examiner*—Mohsen Ahmadi
(74) *Attorney, Agent, or Firm*—Oblon, Spivak, McClelland, Maier & Neustadt, P.C.

(57) ABSTRACT

A substrate processing method using a substrate processing apparatus including: a process container holding a substrate to be processed therein; first gas supplying means having flow rate adjusting means for supplying a first process gas to the process container; and second gas supplying means supplying a second process gas to the process container, the substrate processing method including: a first step of controlling a flow rate of the first process gas to be a first flow rate by the flow rate adjusting means and supplying the first process gas in a first direction; a second step of discharging the first process gas from the process container; a third step of supplying the second process gas to the process container; and a fourth step of discharging the second process gas from the process container, in a repeated manner, wherein a step of stabilizing the flow rate of the process gas is set between a primary first step and a secondary first step performed subsequently to the primary first step.

20 Claims, 8 Drawing Sheets

SUBSTRATE PROCESSING METHOD AND RECORDING MEDIUM

TECHNICAL FIELD

The present invention generally relates to a substrate processing method for processing a substrate and more particularly to a substrate processing method for alternately supplying plural process gases so as to process a substrate.

BACKGROUND ART

Conventionally, in the field of semiconductor device manufacturing technology, generally, a high-quality metallic film, insulating film, or semiconductor film is formed on a surface of a substrate to be processed by MOCVD method.

On the other hand, in recent years, regarding formation of a gate insulating film of a ultrafine semiconductor device in particular, atomic layer deposition (ALD) technology has been studied, in which a high dielectric constant film (referred to as a high-K dielectric film) is formed on a surface of the substrate to be processed by laminating atomic layers one by one.

In the ALD method, metallic compound molecules containing a metallic element constituting the high-K dielectric film are supplied as a material gas in a gas phase to a process space including the substrate to be processed. The metallic compound molecules are chemisorbed on the surface of the substrate to be processed as much as about one molecular layer. Further, after the material gas in a gas phase is purged from the process space, oxidizer such as $H_2O$ is supplied, so that the metallic compound molecules adsorbed on the surface of the substrate to be processed are decomposed and a metal oxide film of about one molecular layer is formed.

Further, after the oxidizer is purged from the process space, the above-mentioned step is repeated, so that a metal oxide film of a desired thickness, namely, a high-K dielectric film is formed.

The ALD method uses chemisorption of compound molecules of materials on the surface of the substrate to be processed in this manner and has properties particularly superior in step coverage. The ALD method is capable of forming a high-quality film at a temperature ranging from 200 to 300° C. or less. In accordance with this, the ALD method is considered to be an effective technique not only for forming the gate insulating film of an ultrafast transistor but also for manufacturing a memory cell capacitor of a DRAM where a dielectric film is required to be formed on a ground having a complicated shape.

FIG. 1A and FIG. 1B are diagrams showing an example of a substrate processing apparatus performing the above-mentioned ALD method and an outline of a procedure of the ALD method.

With reference to FIG. 1A and FIG. 1B, a process container 1 holding a substrate 2 to be processed has a first process gas supplying opening 3A disposed on a first side for the substrate 2 to be processed. Also, a first exhaust opening 4A is disposed on a second side for the substrate 2 to be processed, namely, on the opposite side of the first side. Further, the process container 1 has a second process gas supplying opening 3B disposed on the second side and a second exhaust opening 4B disposed on the first side. A first process gas A is supplied to the first process gas supplying opening 3A via a first material switching valve 5A. A second process gas B is supplied to the second process gas supplying opening 3B via a second material switching valve 5B. Moreover, the first exhaust opening 4A is exhausted via a first exhaust volume adjusting valve 6A and the second exhaust opening 4B is exhausted via a second exhaust volume adjusting valve 6B.

First, in a step shown in FIG. 1A, the first process gas A is supplied to the first process gas supplying opening 3A via the first material switching valve 5A and the first process gas A is adsorbed on the surface of the substrate to be processed in the process container 1. In this case, when the first exhaust opening 4A opposite to the first process gas supplying opening 3A is driven, the first process gas A is flown along the surface of the substrate to be processed in a first direction from the first process gas supplying opening 3A to the first exhaust opening 4A.

Next, in a step shown in FIG. 1B, the second process gas B is supplied to the second process gas supplying opening 3B via the second material switching valve 5B and the second process gas B is flown along the surface of the substrate 2 to be processed in the process container 1. As a result of this, the second process gas B affects molecules of the first process gas A previously adsorbed on the surface of the substrate to be processed and a high-dielectric constant molecular layer is formed on the surface of the substrate to be processed. In this case, when the second exhaust opening 4B opposite to the second process gas supplying opening 3B is driven, the second process gas B is flown along the surface of the substrate to be processed in a second direction from the second process gas supplying opening 3B to the second exhaust opening 4B.

By further repeating the steps shown in FIG. 1A and FIG. 1B, a desired high-dielectric constant film is formed on the substrate 2 to be processed.

Preferably, a purge gas is supplied to the process container 1 as appropriate after the step of FIG. 1A or the step of FIG. 1B so as to discharge the first process gas or the second process gas from the process container 1. In accordance with this, it is possible to reduce process time.

Patent Document 1: Japanese Laid-Open Patent Application No. 2002-151489

In the above-mentioned ALD method, a period of time when the first process gas is being supplied and a period of time when the second process gas is being supplied are short. In other words, the step shown in FIG. 1A and the step shown in FIG. 1B continue for about several seconds, for example. Accordingly, it is necessary to promptly change the status of gas supply to the process container 1.

For example, when a flow rate of the first process gas is controlled, generally, a mass flow controller (also referred to as MFC) omitted in FIG. 1A and FIG. 1B is used. However, when the flow rate of the first process gas is controlled, for example, or when a liquid material is used after vaporization in particular, it is difficult in some cases to perform prompt flow rate control in accordance with the above-mentioned steps based on several seconds.

For example, when a material in a liquid state under normal pressure and temperature is used as the first process gas after vaporization, it is necessary to control the flow rate of the material in a liquid state and to use a liquid mass flow controller. For example, materials which may be used in the above-mentioned ALD method include organometallic compound materials and many of these organometallic compound materials are in a liquid state under normal pressure and temperature.

FIG. 2 is a diagram schematically showing a principle of the liquid mass flow controller controlling the flow rate of the liquid material. FIG. 2 schematically shows a portion of an inside of an example of the liquid mass flow controller in an enlarged manner.

With reference to FIG. 2, a liquid mass flow controller 7 shown in the drawing internally includes a flow path 8A of the liquid material and the flow path 8A is branched into a flow path 8B. In the flow path 8B, flow rate detection means 8C is disposed.

Data on the flow rate detected by the flow rate detection means 8C is sent to control means omitted in the drawings and the control means controls flow rate adjusting means 9 in accordance with the flow rate data so as to control the flow rate of the liquid material, the flow rate adjusting means 9 being described in the following.

The flow rate adjusting means 9 includes pressing means 9B, driving means 9A driving the pressing means 9B upward and downward, a diaphragm 9C, and a sheet portion 9D on which the diaphragm 9C is pressed by the pressing means 9B.

When the flow rate of the liquid material is adjusted, the driving means 9A is controlled by the control means, so that vertical movement of the pressing means 9B is controlled and an extent of the diaphragm 9C to be pressed on the sheet portion 9D is adjusted. In accordance with this, conductance between the sheet portion 9D and the diaphragm 9C is adjusted, so that the flow rate of the liquid material is controlled.

However, when the flow rate of liquid is controlled using the liquid mass flow controller, it is difficult to have differential pressure in the front and rear of the flow rate adjusting means 9, so that a variable range of the conductance is required to be larger in comparison with a case where the flow rate of gas is controlled. Accordingly, the driving means 9A is required to have a large driving force (driving range).

As mentioned above, the driving means 9A has the large driving force (driving range), so that when the flow rate is controlled using the liquid mass flow controller, if a setting value is close to 0 or 0, a possibility that the diaphragm 9C may be pressed on the sheet portion 9D is increased in accordance with fluctuation of a control circuit or variation of environmental change such as temperature.

In this manner, once the diaphragm 9C is pressed on the sheet portion 9D, the diaphragm 9C is attached to the sheet portion 9D, so that even when control is performed so as to increase the flow rate again, a period of time for moving the diaphragm 9C to a position corresponding to the predetermined flow rate is increased.

A delay of response time resulting from such characteristics of the liquid mass flow controller has been problematic when the liquid material is vaporized as the process gas and the substrate is processed by the ALD method, for example, in which prompt supply of materials and stop are repeated a number of times.

For example, in order to prevent such a problem, a supply direction switching valve is disposed immediately before the process container 1 shown in FIGS. 1A and 1B, for example. The process gas is flown to an exhaust line bypassing the process container 1 through a switching operation of the switching valve without changing the flow rate set in the liquid mass flow controller. Or the process gas is supplied to the process container 1 by switching supply directions again.

However, in this case, the process gas exhausted from the exhaust line is wasted and consumption of material is increased, so that an increase of cost is problematic. For example, the above-mentioned liquid material containing a metallic element is an expensive material in many cases, so that the waste of the material results in a great loss in terms of cost of substrate processing.

DISCLOSURE OF THE INVENTION

It is a general object of the present invention to provide an improved and useful substrate processing method and storage medium in which the above-mentioned problems are eliminated.

A more specific object of the present invention is to provide a substrate processing method and storage medium in which the substrate processing method is stored.

Another object of the present invention is to reduce the consumption of the process gas and enable efficient substrate processing in which plural process gases are alternately supplied on the substrate to be processed.

According to a first aspect of the present invention, there is provided a substrate processing method using a substrate processing apparatus including: a process container holding a substrate to be processed therein; first gas supplying means having flow rate adjusting means for supplying a first process gas to said process container; gas switching means disposed between said process container and said gas supplying means, said gas switching means switching supplying directions of the first process gas to a first direction for supplying to said process container or to a second direction for supplying to a gas exhaust line; and second gas supplying means supplying a second process gas to said process container, said substrate processing method comprising: a first step of controlling a flow rate of the first process gas to be a first flow rate by said flow rate adjusting means and supplying the first process gas in the first direction; a second step of discharging the first process gas from said process container; a third step of supplying the second process gas to said process container; and a fourth step of discharging the second process gas from said process container, in a repeated manner, wherein a step of stabilizing the flow rate of the process gas is set between a primary first step and a secondary first step performed subsequently to said primary first step, and said step of stabilizing the flow rate of the process gas includes: a step (A) of switching the supplying directions to the second direction by said gas switching means after said primary first step; a step (B) of reducing the first flow rate to a second flow rate by said flow rate adjusting means after said step (A); and a step (C) of increasing the second flow rate to the first flow rate by said flow rate adjusting means after said step (B).

According to a second aspect of the present invention, there is provided a computer-readable storage medium storing a computer-readable program which, when executed by a computer, causes the computer to perform a substrate processing method using a substrate processing apparatus including: a process container holding a substrate to be processed therein; first gas supplying means having flow rate adjusting means for supplying a first process gas to said process container; gas switching means disposed between said process container and said gas supplying means, said gas switching means switching supplying directions of the first process gas to a first direction for supplying to said process container or to a second direction for supplying to a gas exhaust line; and second gas supplying means supplying a second process gas to said process container, said substrate processing method comprising: a first step of controlling a flow rate of the first process gas to be a first flow rate by said flow rate adjusting means and supplying the first process gas in the first direction; a second step of discharging the first process gas from said process container; a third step of supplying the second process gas to said process container; and a fourth step of discharging the second process gas from said process container, in a repeated manner, wherein a step of stabilizing the flow rate of the process gas is set between a primary first step and a secondary first step performed subsequently to said primary first step, and said step of stabilizing the flow rate of the process gas includes: a step (A) of switching the supplying directions to the second direction by said gas switching means after said primary first step; a step (B) of reducing the first flow rate to a second flow rate by said flow rate adjusting means after said step (A); and a step (C) of increasing the second flow rate to the first flow rate by said flow rate adjusting means after said step (B).

According to the present invention, in substrate processing where plural process gases are alternately supplied on the substrate to be processed, consumption of the process gas is reduced, so that efficient substrate processing is possible.

Other objects, features and advantage of the present invention will become more apparent from the following detailed description when read in conjunction with the accompanying drawings.

DESCRIPTION OF REFERENCE NUMERALS

Figure 1A:
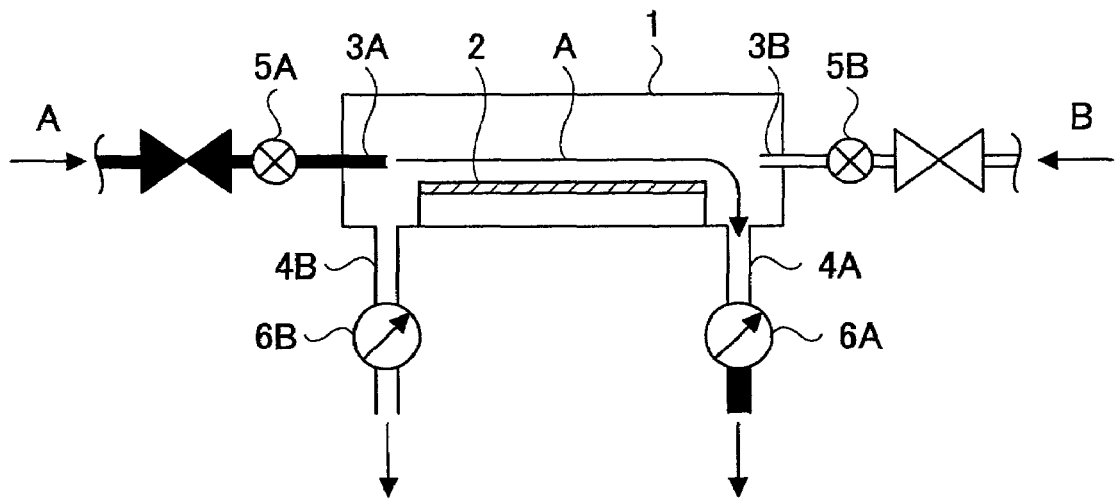
FIG. 1A is a (first) diagram showing a conventional substrate processing method.

10 substrate processing apparatus
10A control means
11 process container
11A cover plate
11B outer container
12 reaction container
12A upper container
12B lower container
13 holding stage
14 guard ring
15A, 15B exhaust opening
16A, 16B process gas nozzle
17A, 17B high-speed rotary valves
19 bellows
20 rotation shaft
21 bearing
22 magnetic seal
52A, 52B switching valve
54A, 54B gas line
59B, 65A, 65B, 68A mass flow controller
59A liquid mass flow controller
62 vaporizer
61A, 61B material container
61a, 61b material

BEST MODE FOR CARRYING OUT THE INVENTION (Principle)

Figure 3A:
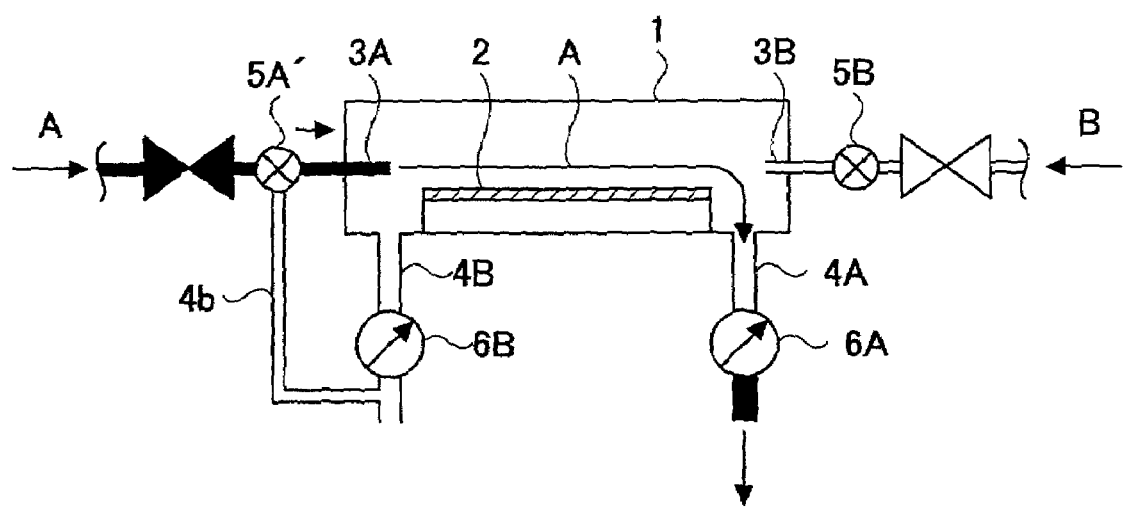
FIG. 3A is a (first) diagram showing a principle of the present invention.
Figure 3B:
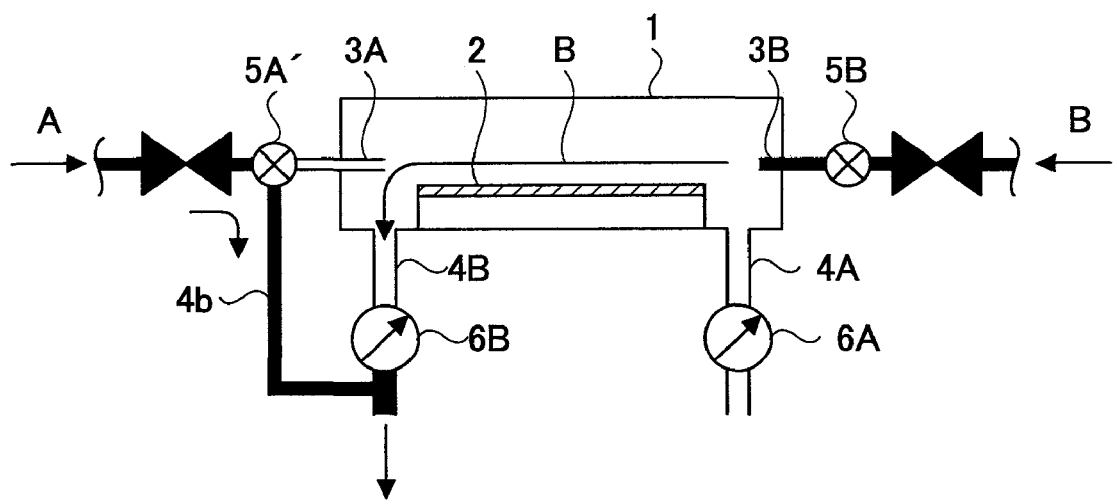
FIG. 3B is a (second) diagram showing a principle of the present invention.

FIG. 3A and FIG. 3B show a principle of the present invention. However, the same reference numerals are assigned to portions corresponding to the above-mentioned portions in FIG. 1A and FIG. 1B and description thereof is omitted.

In a substrate processing apparatus shown in the drawings, a first material switching valve 5A' corresponding to the first material switching valve 5A is disposed. An exhaust pipe 4b is connected to the first material switching valve 5A', and the exhaust pipe 4b is exhausted together with the exhaust opening 4B.

In this case, in a step of FIG. 3A, in the same manner as in the step shown in FIG. 1A, the first process gas A is supplied to the first process gas supplying opening 3A via the first material switching valve 5A' and the first process gas A is flown along the surface of the substrate to be processed in the first direction from the first process gas supplying opening 3A to the first exhaust opening 4A.

Figure 1B:
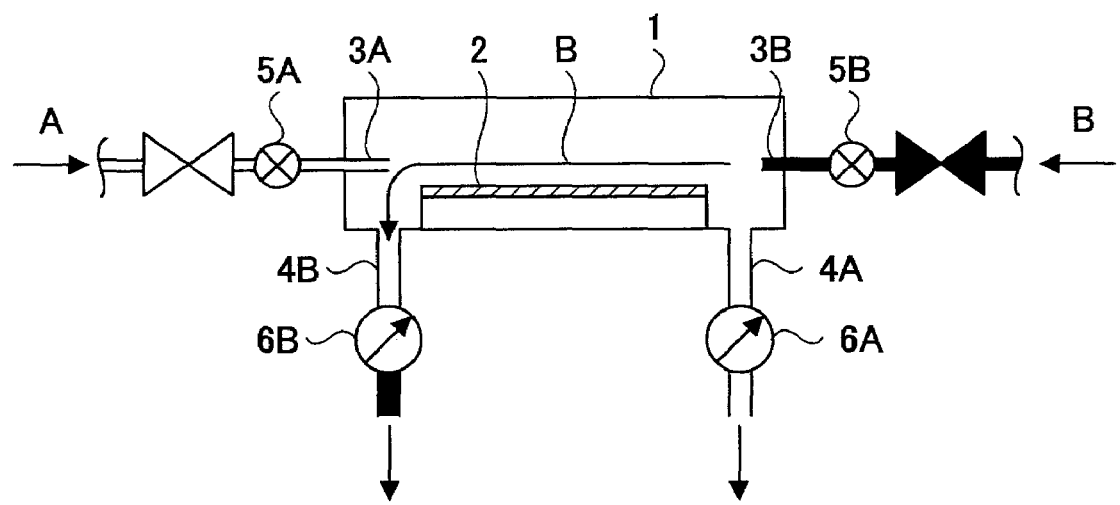
FIG. 1B is a (second) diagram showing a conventional substrate processing method.

Next, in a step shown in FIG. 3B, in the same manner as in the step shown in FIG. 1B, the second process gas B is supplied to the second process gas supplying opening 3B via the second material switching valve 5B and the second process gas B is flown along the surface of the substrate to be processed in the second direction from the second process gas supplying opening 3B to the second exhaust opening 4B.

In the present invention, in the step of FIG. 3B, the direction where the first process gas is supplied is switched to a direction of the exhaust pipe 4b by the first material switching valve 5A' and the supply of the first process gas continues without a stop in the step of FIG. 3B. In accordance with this, it is possible to promptly have a stable flow rate of the first process gas when the step of FIG. 3A is resumed.

However, in this case, a percentage of the first process gas exhausted to the exhaust pipe 4b is large relative to that of the first process gas contributing to film formation, so that the increase of the consumption of an expensive material is problematic. In view of this, in the present invention, the flow rate of the process gas exhausted to the exhaust line is minimized through control.

Figure 4:
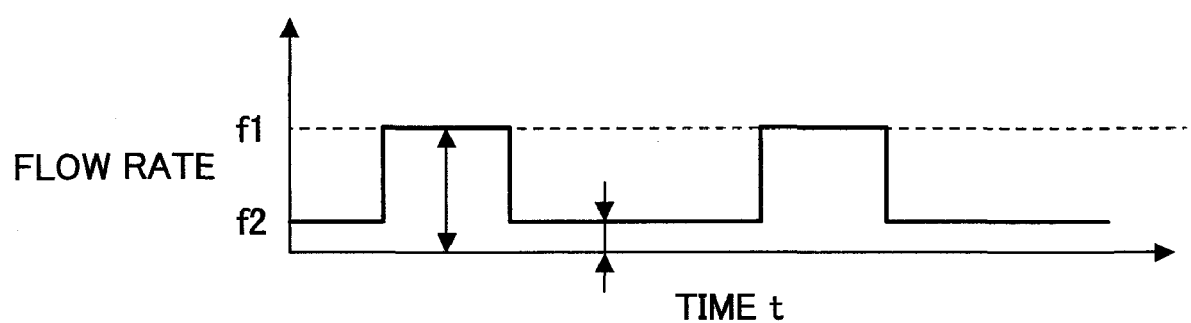
FIG. 4 is a (third) diagram showing a principle of the present invention.

FIG. 4 schematically shows the flow rate of the first process gas in the steps of FIG. 3A to FIG. 3B.

With reference to FIG. 4, the flow rate of the first process gas is controlled to be changed alternately between a flow rate f1 and a flow rate f2. In this case, the control is performed such that the flow rate is f1 in the step shown in FIG. 3A and the flow rate is f2 in the step shown in FIG. 3B. This provides an effect in which an amount of the first process gas exhausted from the exhaust pipe 4b is controlled so as to have a stable flow rate.

Further, in this case, preferably, the flow rate f2 is large enough as to control the delay of the response of the flow rate control and is small enough so as to control an amount of wasted first process gas. Preferably, the flow rate f2 is within a suitable range so as to satisfy these conditions.

Moreover, upon substrate processing, the first process gas and the second process gas are discharged from the substrate processing apparatus. In this case, the first process gas and the second process gas may be mixed outside the substrate processing apparatus, namely, on an installation side where the substrate processing apparatus is disposed, for example, and a by-product may be formed. Accordingly, on the installation side, exhaust pipes for the first process gas and the second process gas may be separated or individual exhaust devices maybe required, so that a problem of an increase of cost may be occurred.

In a substrate processing method according to the present invention, the amount of the first process gas to be discharged is reduced, so that the formation of such a by-product is reduced and an effect of reducing cost for disposing and maintaining the substrate processing apparatus is provided.

Moreover, the amount of the first process gas to be discharged is reduced, so that it is possible to simplify an exhaust system on the substrate processing apparatus. These effects are further improved by optimizing a sequence of substrate processing.

In the following, specific examples of an embodiment of the present invention are described with reference to the drawings.

Embodiment 1

Figure 5:
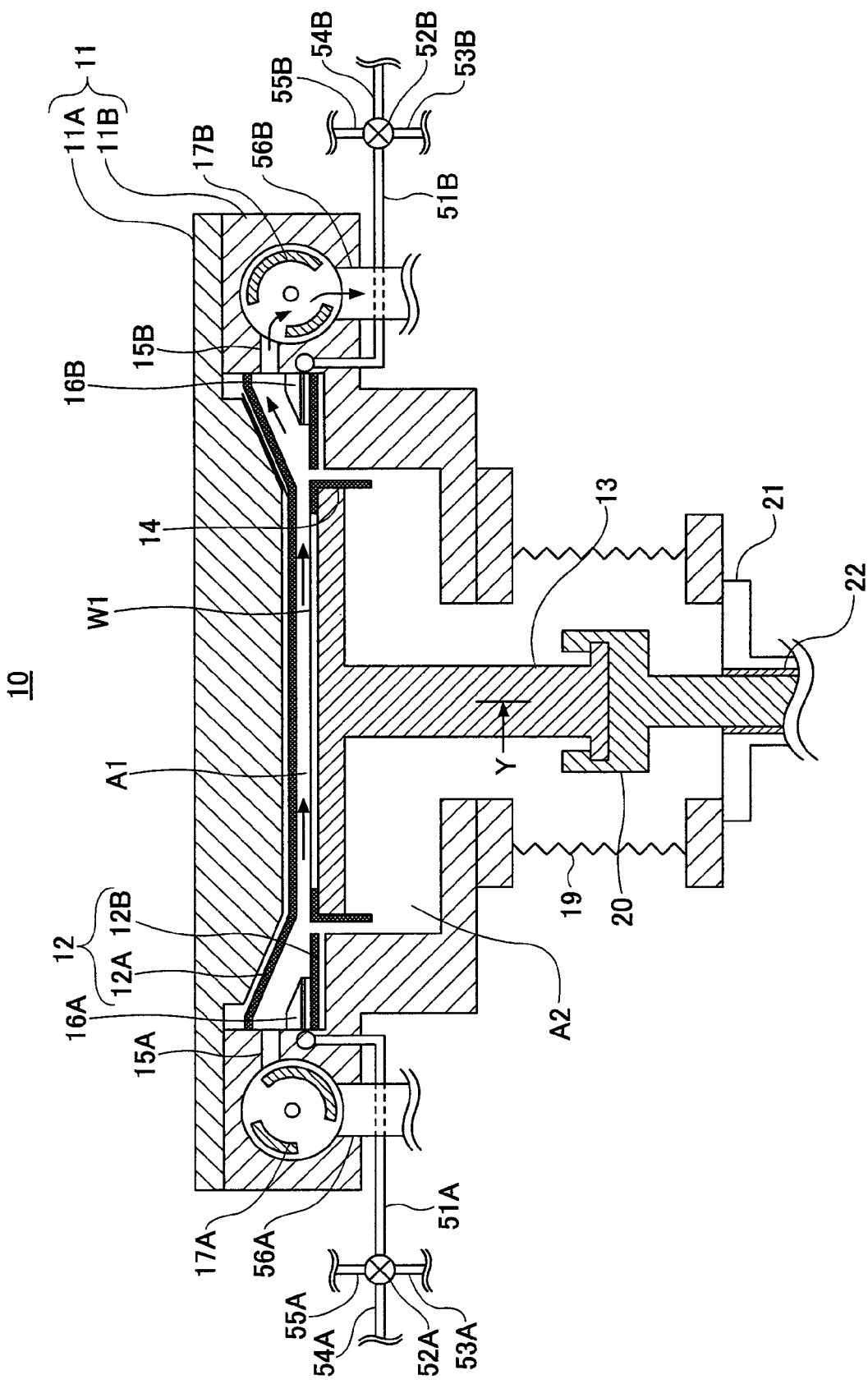
FIG. 5 is a (first) diagram schematically showing a substrate processing apparatus according to embodiment 1.

FIG. 5 is a cross-sectional view schematically showing a substrate processing apparatus 10 as an example of a substrate processing apparatus capable of forming a film using the ALD method according to embodiment 1 of the present invention.

With reference to FIG. 5, the substrate processing apparatus 10 includes a process container 11 having an outer container 11B made of aluminum alloy and a cover plate 11A disposed so as to cover an opened portion of the outer container 11B. A reaction container 12 made of quartz, for example, is disposed in a space defined by the outer container 11B and the cover plate 11A and a process space A1 is defined inside the reaction container 12. The reaction container 12 has a structure where an upper container 12A and a lower container 12B are combined.

In this case, an inner space of the process container 11 is substantially separated into the process space A1 defined inside the reaction container 12 and an outer space A2 which is positioned around the process space A1 and includes a clearance between the reaction container 12 and an inner wall of the process container 11.

Further, a lower end of the process space A1 is defined by a holding stage 13 holding a substrate W1 to be processed. A guard ring 14 made of quartz glass is disposed on the holding stage 13 so as to surround the substrate W1 to be processed. Moreover, the holding stage 13 is extended downward from the outer container 11B and is disposed inside the outer container 11B on which a substrate conveying opening omitted in the drawings is disposed such that the holding stage 13 is capable of ascending and descending between an upper end position and a lower end position.

The holding stage 13 defines the process space A1 together with the reaction container 12 at the upper end position. In other words, a substantially circular opening portion is formed on the lower container 12B of the reaction container 12 and when the holding stage 13 is moved to the upper end position, the opening portion is covered with the holding stage 13. In this case, a bottom of the lower container 12B and a surface of the substrate W1 to be processed substantially form the same plane in terms of positional relationship.

The holding stage 13 is held in rotatable and vertically movable manner via a rotation shaft 20 held in a bearing 21 using a magnetic seal 22. A space where the rotation shaft 20 is vertically moved is sealed using a partition such as bellows 19.

A status shown in FIG. 5 indicates a case where the process space A1 is defined and film formation is performed on the substrate W1 to be processed on the holding stage 13. By contrast, a status shown in FIG. 6, for example, indicates a case where the holding stage 13 has descended to the lower end position and the substrate to be processed is positioned at a height corresponding to the substrate conveying opening formed on the outer container 11B and omitted in the drawings. In this status, by driving a mechanism for holding the substrate to be processed such as a lifter pin omitted in the drawings, it is possible to take in or out the substrate to be processed.

Moreover, the cover plate 11A has a thick central portion, so that the process space A1 defined inside the reaction container 12 disposed in the space defined by the outer container 11B and the cover plate 11A has a reduced height or volume at a central portion of the substrate W1 to be processed which is positioned while the holding stage 13 has ascended to the upper end position and also has a gradually increasing height toward both end portions.

In the substrate processing apparatus 10, an exhaust opening 15A and an exhaust opening 15B for exhausting the process space A1 are disposed on both ends of the process space A1 in an opposing manner across the substrate to be processed. High-speed rotary valves 17A and 17B communicating with exhaust pipes 56A and 56B, respectively, are disposed on the exhaust openings 15A and 15B.

Further, on both ends of the process space A1, process gas nozzles 16A and 16B formed into a bird's beak shape for regulating gas flow paths to the high-speed rotary valves 17A and 17B are disposed so as to face the high-speed rotary valves 17A and 17B, respectively, and in an opposing manner across the substrate to be processed.

The process gas nozzle 16A is connected to a gas line 54A, a purge line 55A, and a gas exhaust line 53A via a switching valve 52A. In the same manner, the process gas nozzle 16B is connected to a gas line 54B, a purge line 55B, and a gas exhaust line 53B via a switching valve 52B.

For example, from the process gas nozzle 16A, the first process gas supplied from the gas line 54A and purge gas supplied from the purge line 55A are introduced to the process space A1 via the switching valve 52A. And, the first process gas supplied from the gas line 54A and the purge gas supplied from the purge line 55A are exhausted from the gas exhaust line 53A via the switching valve 52A.

In the same manner, from the process gas nozzle 16B, the second process gas supplied from the gas line 54B and purge gas supplied from the purge line 55B are introduced to the process space A1 via the switching valve 52B. And, the second process gas supplied from the gas line 54B and the purge gas supplied from the purge line 55B are exhausted from the gas exhaust line 53B via the switching valve 52B.

The first process gas introduced from the process gas nozzle 16A is flown along the surface of the substrate W1 to be processed in the process space A1 inside the reaction container 12 and is exhausted from the opposite exhaust opening 15B via the high-speed rotary valve 17B. In the same manner, the second process gas introduced from the process gas nozzle 16B is flown along the surface of the substrate W1 to be processed in the process space A1 inside the reaction container 12 and is exhausted from the opposite exhaust opening 15A via the high-speed rotary valve 17A.

In this manner, by alternately flowing the first and second gases from the process gas nozzle 16A to the exhaust opening 15B or from the process gas nozzle 16B to the exhaust opening 15A, it is possible to perform film formation based on an atomic layer. In this case, following the supply of the first process gas to the process space A1, until the second process gas is subsequently supplied, it is preferable to have a process for exhausting the first process gas from the process space A1 such as a purge step of introducing the purge gas or an exhaust step of evacuating the process space A1. In the same manner, following the supply of the second process gas to the process space A1, until the first process gas is subsequently supplied, it is preferable to have a process for exhausting the second process gas from the process space A1 such as the purge step of introducing the purge gas or the exhaust step of evacuating the process space A1.

For example, by using a gas containing an organometallic compound having a metallic element such as Hf, Zr, or the like as the first process gas and by using a gas containing oxidation gas such as $O_3$, $H_2O$, $H_2O_2$, or the like, oxidizing an organometallic compound, it is possible to form a high-dielectric constant metallic oxide or a compound of those materials on the substrate to be processed.

Next, an entire portion of the substrate processing apparatus 10 is schematically described with reference to FIG. 7.

Figure 6:
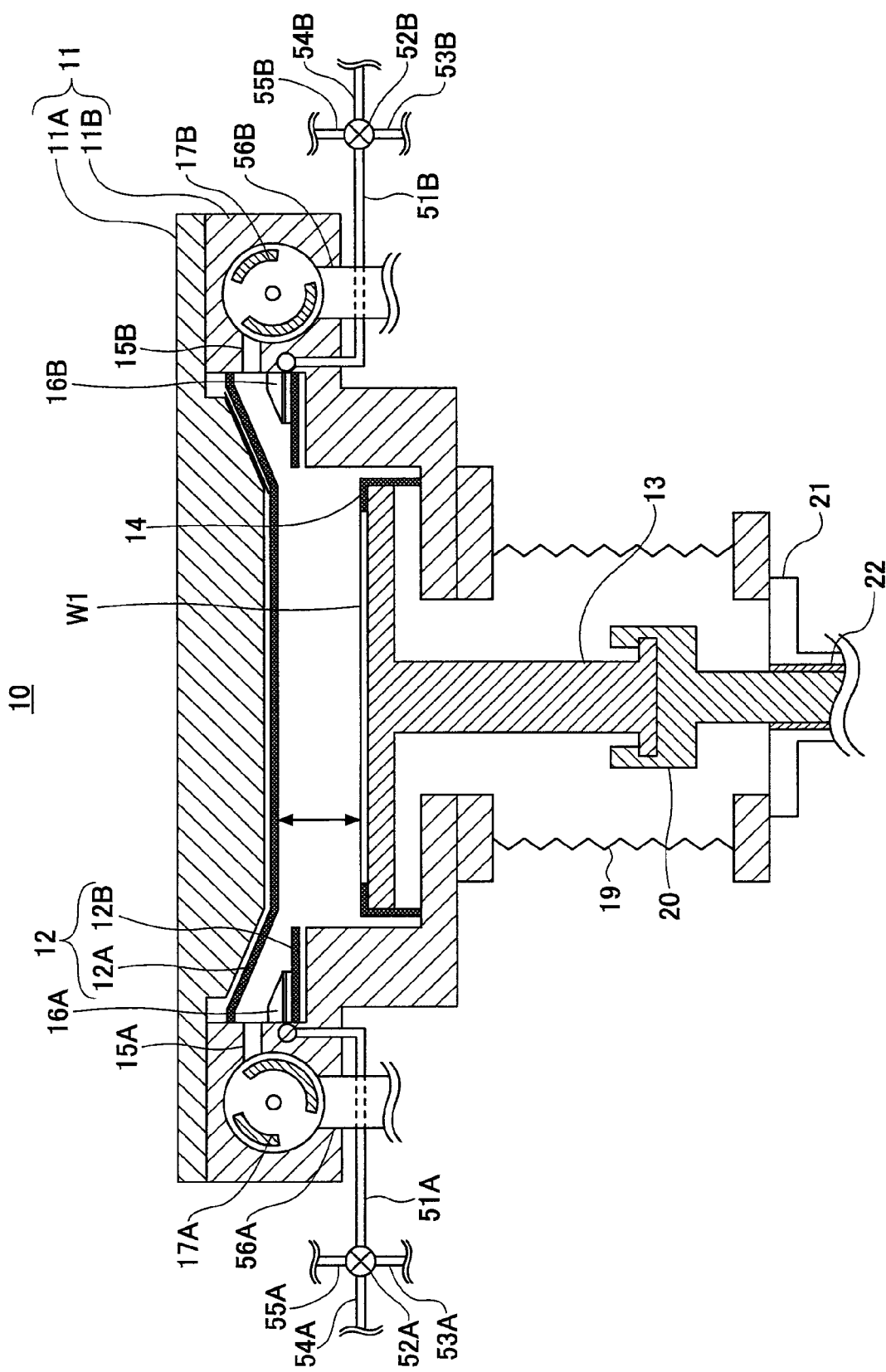
FIG. 6 is a (second) diagram schematically showing a substrate processing apparatus according to embodiment 1.
Figure 7:
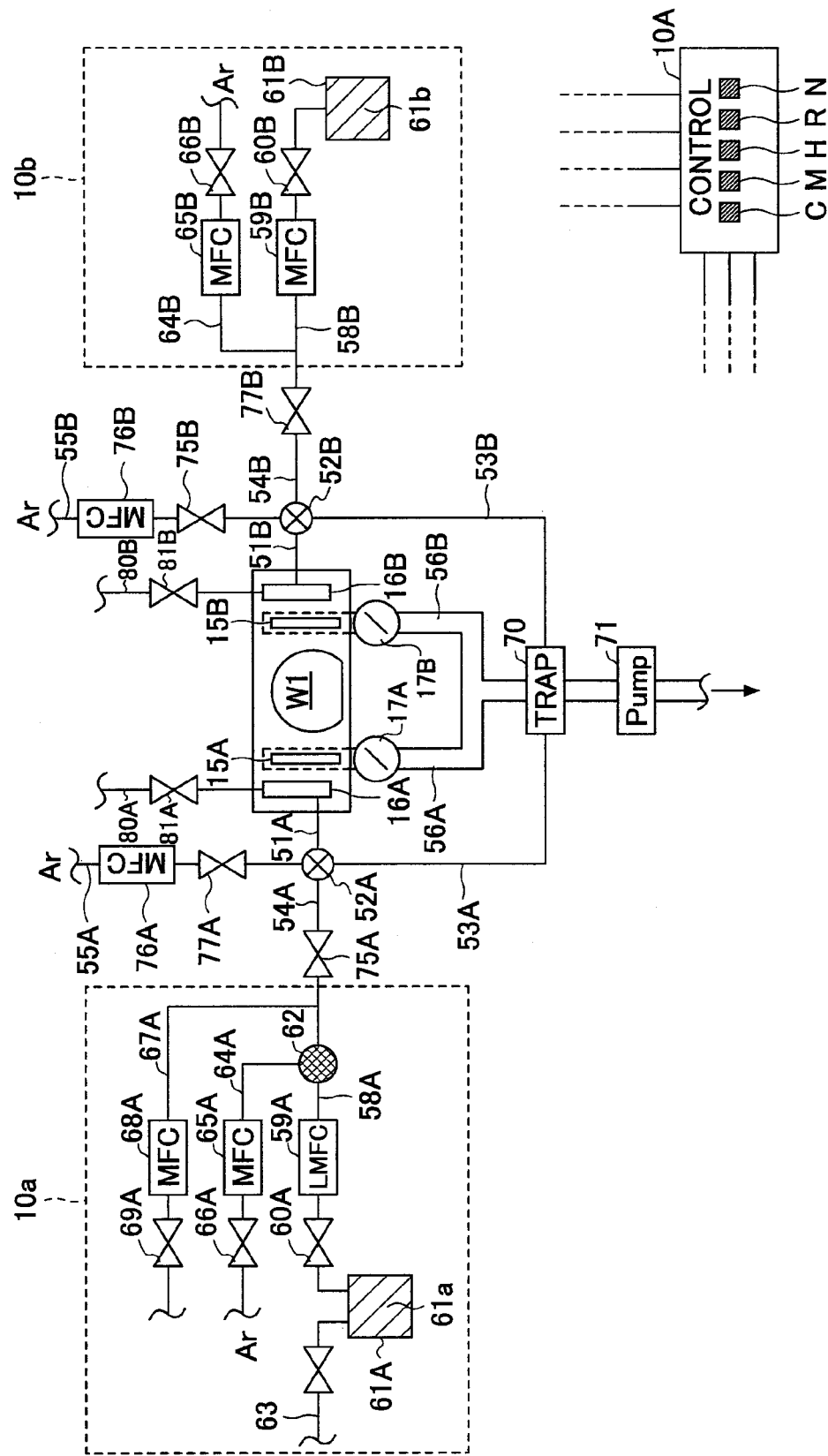
FIG. 7 is a diagram schematically showing an entire portion of a substrate processing apparatus according to embodiment 1.

FIG. 7 is a diagram schematically showing an entire portion of the substrate processing apparatus 10 shown in FIG. 5 and FIG. 6. In the drawing, the same reference numerals are assigned to the above-mentioned portions and description thereof is omitted. In addition, in this drawing, portions described in FIG. 5 and FIG. 6 are partially omitted and partially simplified for display.

With reference to FIG. 7, the gas line 54A is connected to the switching valve 52A connected to the process gas nozzle 16A. Process gas supplying means 10a for supplying the first process gas to the process space A1 is connected to the gas line 54A via a valve 75A. Further, the purge line 55A for supplying the purge gas to the process space A1 is connected to the switching valve 52A. The switching valve 52A is capable of switching connections such that the first process gas is supplied to the process space A1 or exhausted via the gas exhaust line 53A connected to the switching valve 52A. Moreover, the switching valve 52A is capable of switching connections such that the purge gas is supplied to the process space A1 or exhausted via the gas exhaust line 53A.

On the other hand, in the same manner, the gas line 54B is connected to the switching valve 52B connected to the process gas nozzle 16B. Process gas supplying means 10b for supplying the second process gas to the process space A1 is connected to the gas line 54B via a valve 75B. Further, the purge line 55B for supplying the purge gas to the process space A1 is connected to the switching valve 52B. The switching valve 52B is capable of switching connections such that the second process gas is supplied to the process space A1 or exhausted via the gas exhaust line 53B connected to the switching valve 52B. Moreover, the switching valve 52B is capable of switching connections such that the purge gas is supplied to the process space A1 or exhausted via the gas exhaust line 53B.

Moreover, the gas exhaust lines 53A and 53B are connected to a trap 70 and the exhaust pipes 56A and 56B for exhausting the process container are connected the trap 70. In other words, the line for exhausting the process gas and the line exhausting the process container are connected via the trap and the trap 70 is exhausted by exhaust means 71 such as a vacuum pump.

Next, with reference to the process gas supplying means 10a, the process gas supplying means 10a includes a vaporizer 62 connected to the valve 75A, the vaporizer 62 vaporizing a liquid material. A material line 58A for supplying the liquid material and a gas line 64A for supplying a carrier gas to the vaporizer 62 are connected to the vaporizer 62.

A material container 61A for storing a material 61a in a liquid state at normal temperature is connected to the material line 58A. By releasing a valve 60A, the material 61a whose flow rate is controlled by a liquid mass flow controller 59A is supplied to the vaporizer 62 and the material 61a is vaporized. In this case, an inert gas such as He, for example, may be supplied from a gas line 63 connected to the material container 61A so as to press the material 61a for supply.

Further, a valve 66A and a mass flow controller 65A are attached to the gas line 64A. By releasing the valve 66A, the carrier gas whose flow rate is controlled is supplied to the vaporizer 62.

The material 61a vaporized by the vaporizer 62 and used as the first process gas is supplied to the gas line 54A along with the carrier gas by releasing the valve 75A and is supplied to the process space A1 via the switching valve 52A or exhausted via the gas exhaust line 53A.

Moreover, where appropriate, a gas line 67A to which a valve 69A and a mass flow controller 68A are attached may be connected between the valve 75A and the vaporizer 62. For example, the first process gas may be diluted with a gas supplied from the gas line 67A or a desired gas may be added to the first process gas.

Further, a valve 77A and a mass flow controller 76A are attached to the purge line 55A connected to the switching valve 52A. By releasing the valve 77A, it is possible to supply the purge gas to the process space A1 while controlling the flow rate and to purge the process space A1.

On the other hand, with reference to the process gas supplying means 10b, the process gas supplying means 10b includes a material line 58B and a gas line 64B connected to the valve 75B. A valve 60B and a mass flow controller 59B are attached to the material line 58B and a material container 61B for storing a material 61b made of oxidation gas or the like oxidizing the material 61a, for example, is connected to the material line 58B.

When $O_3$ is used as the material 61b, for example, an ozonizer is disposed on a portion corresponding to the material container 61B. In this manner, the material container 61B is not limited to a container storing the material but may include means synthesizing or generating the material and means transporting the material depending on material types to be used.

Further, a valve 66B and a mass flow controller 65B are attached to the gas line 64B. In this case, by releasing the valves 66B, 60B, and 75B, it is possible to supply the second process gas containing the material 61b and the carrier gas whose flow rates are controlled to the process space A1 via the switching valve 52B. Moreover, by switching the switching valve 52B, it is possible to exhaust the second process gas via the gas exhaust line 53B.

Moreover, a valve 77B and a mass flow controller 76B are attached to the purge line 55B connected to the switching valve 52B. By releasing the valve 77B, it is possible to supply the purge gas to the process space A1 while controlling the flow rate and to purge the process space A1.

In this manner, the first process gas, the second process gas, or the purge gas supplied to the process space A1 is exhausted form the exhaust openings 15A and 15B via the high-speed rotary valves 17A and 17B and the exhaust pipes 56A and 56B.

In addition, vent lines 80A and 80B to which valves 81A and 81B are respectively attached are connected to the process gas nozzles 16A and 16B. For example, by introducing the purge gas to the process gas nozzles 16A and 16B and releasing the valves 81A and 81B, it is possible to purge the gas nozzles.

For example, when the purge gas is introduced to the process space via the process gas nozzles 16A and 16B so as to purge the process space, it is preferable to purge the process gas remaining in the process gas nozzles 16A and 16B in advance, so that the process space is promptly purged.

Further, in FIG. 7, although the material in a liquid state at normal temperature is employed as an example used as the first process gas, the material is not limited to this. It is possible to use a material in a solid state at normal temperature or a material in a gas state at normal temperature.

Further, the substrate processing apparatus 10 according to the present embodiment includes control means 11A having a computer built therein, the control means 10A controlling operation of substrate processing such as film formation. The control means 10A includes a storage medium storing a program of a method for processing a substrate such as a substrate processing method for operating the substrate processing apparatus. Based on the program, the computer enables operation of the substrate processing apparatus.

For example, the control means 10A includes a CPU (computer) C, memory M, storage medium H such as a hard disk, storage medium R as a removable storage medium, and network connection means N. The control means 10A further includes a bus omitted in the drawings to which these elements are connected. The bus is connected to the above-mentioned valve of the substrate processing apparatus, exhaust means, mass flow controller, and the like, for example. Although a program for operating the film forming apparatus is stored in the storage medium H, it is possible to input the program via the storage medium R or the network connection means N. The following example of substrate processing shows a case where the substrate processing apparatus is controlled based on the program stored in the control means.

Figure 8:
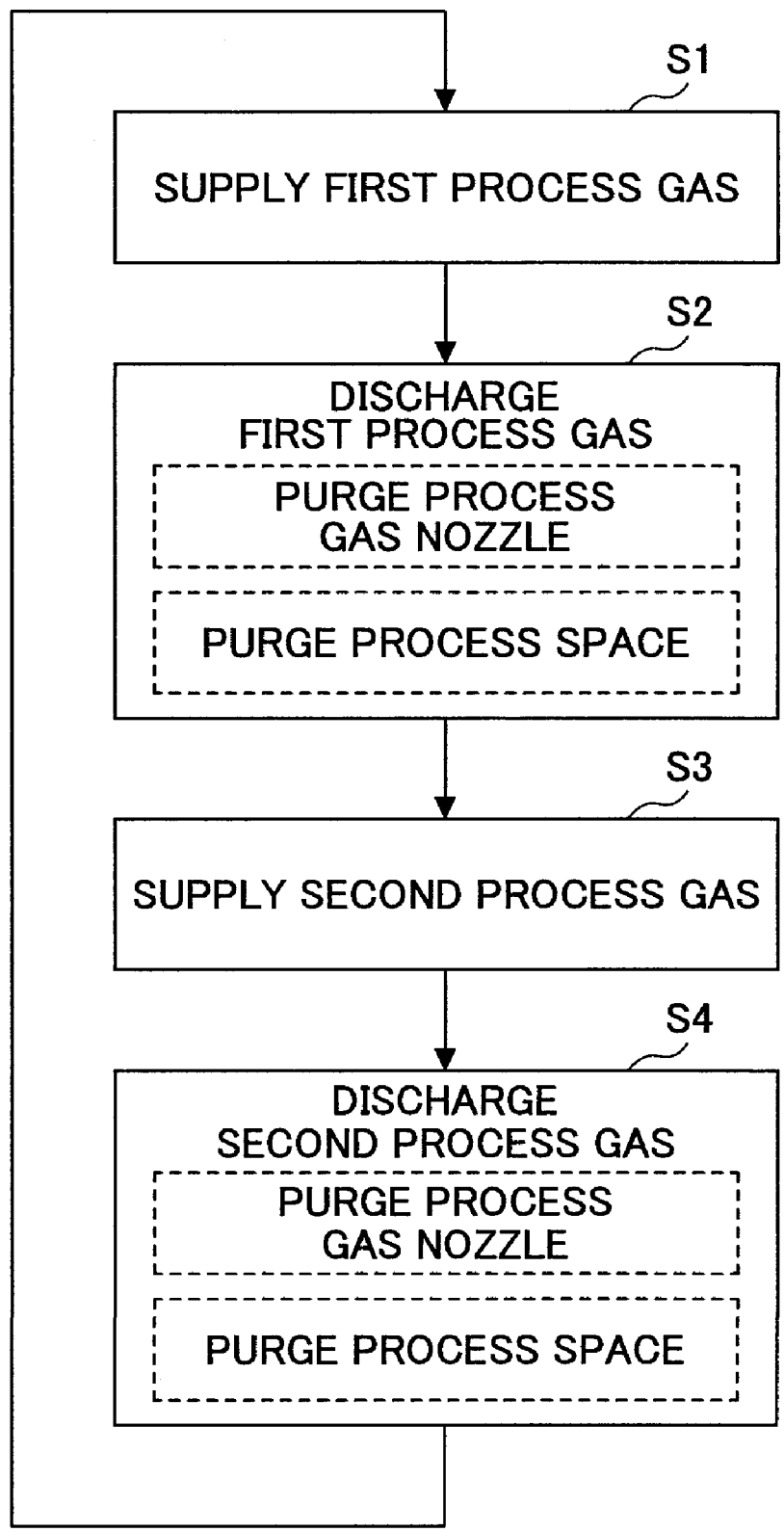
FIG. 8 is a flowchart showing a substrate processing method according to embodiment 1.
Figure 9:
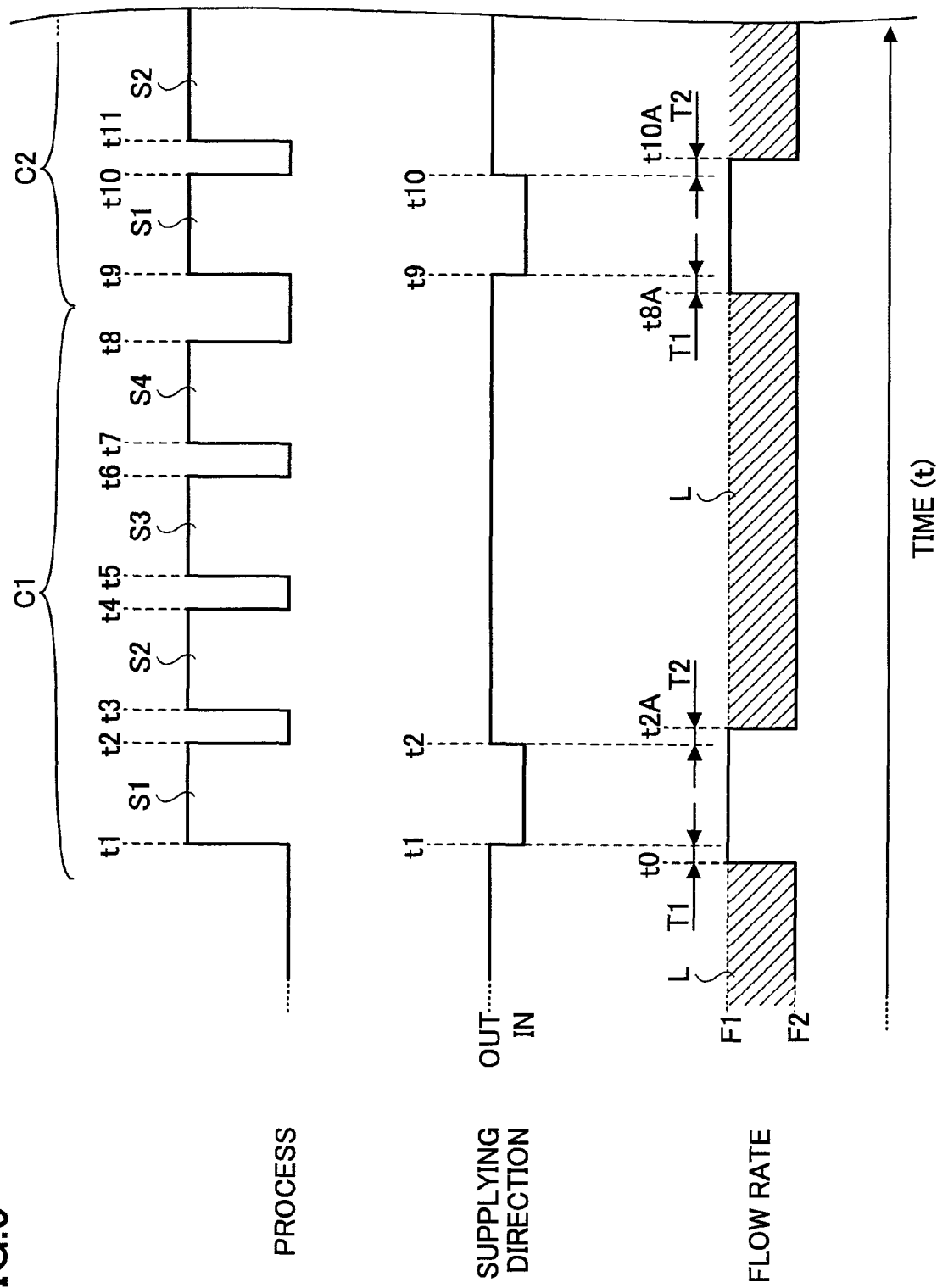
FIG. 9 is a time chart showing a substrate processing method according to embodiment 1.

Next, an example of details of film formation using the substrate processing apparatus with reference to FIG. 8 and FIG. 9. FIG. 8 is a flowchart showing a substrate processing method according to the present embodiment. As shown in FIG. 8, the substrate processing method according to the present embodiment substantially includes four steps (step 1 to step 4 shown as S1 to S4 in the drawing). In FIG. 9, a horizontal axis indicates time. Times of performing step 1 to step 4 are schematically indicated and a direction of supplying the first process gas and the flow rate of the material 61a controlled by the liquid mass flow controller 59A is schematically indicated. Regarding the supplying direction of the first process gas, a direction displayed as IN in the drawing indicates a direction for supplying to the process container and a direction displayed as OUT indicates a direction for supplying to the exhaust line 53A (first process gas is disposed of).

With reference to FIG. 8 and FIG. 9, the substrate processing method according to the present embodiment is mainly constituted using step 1 to step 4 and processes of step 1 to step 4 are repeated predetermined times. First, before step 1 is started, a flow rate stabilization step is started so as to have a stable flow rate of the first process gas. A sequence of the flow rate stabilization step is schematically indicated in FIG. 9 as the supplying direction of the first process gas and a controlled flow rate of the first process gas.

In the flow rate stabilization step, before step 1 is started, supply of the first process gas is started. In this case, the supplying direction of the first process gas (hereafter referred to as supplying direction) is determined as the gas exhaust line 53A (OUT) by the switching valve 52A. The valves 75A, 60A, and 66A are released and the material 61a whose flow rate is controlled by the liquid mass flow controller 59A and which is made of TEMAH (Tetrakis Ethyl Methyl Amino Hafnium), for example, and the carrier gas whose flow rate is controlled by the mass flow controller 65A and which is made of Ar, for example, are supplied to the vaporizer 62.

In this case, when the liquid material 61a is vaporized, the material 61a is mixed with the carrier gas. Further, in this case, an assist gas supplied from the gas line 67A and is made of Ar, for example, may be added. In this case, the liquid material 61a is supplied to the vaporizer 62 at a rate of 10 mg/min, for example. This flow rate corresponds to the flow rate F2 in FIG. 9. Moreover, the flow rate F2 corresponds to the flow rate of the vaporized first process gas.

Next, at time t0 indicated in FIG. 9, the flow rate of the material 61a is increased by the liquid mass flow controller 59A and is set as the flow rate F1. The flow rate F1 is the same as a set flow rate in step 1 to be subsequently started. In this case, the flow rate F1 is 100 mg/min, for example. Further, the flow rate F1 corresponds to the flow rate of the vaporized first process gas.

Next, at time t1 immediately after time t0, step 1 is started. The supplying direction is switched to the direction (IN) of the process container by the switching valve 52A and gases necessary for processing such as the first process gas and the carrier gas are supplied to the process space A1. In this case, the flow rate F1 for supplying to the vaporizer 62 is maintained. Although control of the flow rate by the liquid mass flow controller 59A requires time, preferably, a time difference T1 between t0 and t1 is from about one second to not more than two seconds.

The supplied first process gas is formed into a laminar flow, for example, flown along the surface of the substrate to be processed, and exhausted from the exhaust opening 15B via the high-speed rotary valve 17B. In this case, the material 61a contained in the first process gas is adsorbed in the substrate to be processed as much as about one molecular (one atomic) layer, for example.

After step 1 is performed for a predetermined time, namely, for several seconds, for example, step 1 is ended at time t2. Upon ending step 1, the supplying direction is switched to OUT by the switching valve 52A and the supply of the first process gas to the process space A1 is stopped.

When step 1 is ended, at time t2A immediately after time t2, the flow rate is controlled by the liquid mass flow controller 59A such that the flow rate F1 is reduced to the flow rate F2 again. Thereafter, from step 2 to step 4, the supplying direction is maintained to be OUT (direction of the gas exhaust line 53A) and the flow rate of the material 61a for supplying to the vaporizer 62 is maintained to be the flow rate F2.

Next, step 2 is started at time t3. In this case, time t2 and time t3 may be the same. In other words, when step 1 is ended, step 2 may be started at the same time. In this case, after step 2 is started, control to change from the flow rate F1 to the flow rate F2 is performed. Although control of the flow rate by the liquid mass flow controller 59A requires time, preferably, a time difference T2 between t2 and t2A is from about one second to not more than two seconds. When the flow rate F2 is about 20% of a maximum flow rate setting of the liquid mass flow controller 59A, operation of a driving mechanism of the liquid mass flow controller for controlling the flow rate is optimized. Thus, high-speed control is possible, so that the time difference T1 and T2 are further reduced.

When step 2 is started, the first process gas remaining in the process space A1 is discharged from the process space A1. In this case, preferably, the process gas nozzle 16A is purged first so as to discharge the first process gas remaining in the process gas nozzle 16A, for example, and then the purge gas is supplied from the process gas nozzle 16A to the process space A1 so as to purge the process space A1, so that the first process gas remaining in the process space A1 is promptly purged.

Further, after the supply of the purge gas is stopped, time for evacuating the process space may be set. Step 2 is performed for a predetermined time, namely, for several seconds, for example. Step 2 is ended at time t4.

Next, step 3 is started at time t5. In this case, time t4 and time t5 may be the same.

When step 3 is started, the material 61b as the second process gas and the carrier gas are supplied to the process space A1. In this case, the valves 75B, 60B, and 66B are released and the material 61b whose flow rate is controlled by the mass flow controller 59B and the carrier gas whose flow rate is controlled by the mass flow controller 65B and which is made of Ar, for example, are supplied from the process gas nozzle 16B to the process space A1 via the switching valve 52B. When the material 61b is $O_3$, for example, an ozonizer is disposed on a portion corresponding to the material container 61B, so that $O_2$ and $N_2$ are supplied to the ozonizer. For example, $O_3$ having concentration of 200 g/Nm$^3$ is supplied to the process space A1 together with $O_2$ of 1000 sccm.

The supplied second process gas is formed into a laminar flow, for example, flown along the surface of the substrate to be processed, and exhausted from the exhaust opening 15A via the high-speed rotary valve 17A. In this case, the material 61b reacts with the material 61a adsorbed in the substrate to be processed and a $HfO_2$ layer as much as about one molecule or several molecules, for example, is formed on the substrate to be processed.

After step 3 is performed for a predetermined time, namely, for several seconds, for example, the supply of the second process gas is stopped at time t6 and step 3 is ended.

Next, step 4 is started at time t7. In this case, time t6 and time t7 may be the same. In other words, when step 3 is ended, step 4 may be started at the same time.

When step 4 is started, the second process gas remaining in the process space A1 is discharged from the process space A1. In this case, preferably, the process gas nozzle 16B is purged first so as to discharge the second process gas remaining in the process gas nozzle 16B, for example, and then the purge gas is supplied from the process gas nozzle 16B to the process space A1 so as to purge the process space A1, so that the second process gas remaining in the process space A1 is promptly purged.

Further, after the supply of the purge gas is stopped, time for evacuating the process space may be set. Step 4 is performed for a predetermined time, namely, for several seconds, for example. Step 4 is ended at time t8.

Next, the process returns to step 1 again and step 1 is started again at t9. In this case, before step 1 is started, in the same manner as in the first step 1, at t8A immediately before time t9, the flow rate of the material 61a is increased by the liquid mass flow controller 59A and is set as the flow rate F1 again. The flow rate F1 is the same as a set flow rate in step 1 to be subsequently started. In this case, the flow rate F1 is 100 mg/min, for example. Further, the flow rate F1 corresponds to the flow rate of the vaporized first process gas.

Next, at time t9 immediately after time t8A, step 1 is started and the supplying direction is switched to the direction (IN) of the process container by the switching valve 52A and gases necessary for processing such as the first process gas and the carrier gas are supplied to the process space A1. In this case, the flow rate F1 for supplying to the vaporizer 62 is maintained. Further, time t8 and time t9 may be the same. In this case, before step 4 is ended, namely, during the process of step 4, the above-mentioned control is performed such that the flow rate of the material 61a is increased and is set as the flow rate F1 again.

Thereafter, the same processes as from step 1 to step 4 are repeated. In other words, step 1 is ended at time t10 and the supplying direction is switched to OUT by the switching valve 52A and the supply of the first process gas to the process space A1 is stopped.

When step 1 is ended, at time t10A immediately after time t10, the flow rate is controlled by the liquid mass flow controller 59A such that the flow rate F1 is reduced to the flow rate F2 again. Thereafter, from step 2 to step 4, the supplying direction is maintained to be OUT (direction of the gas exhaust line 53A) and the flow rate of the material 61a for supplying to the vaporizer 62 is maintained to be the flow rate F2.

In this manner, by repeating the same processes, the processes from step 1 to step 4 are repeated predetermined times, so that it is possible to form a high-quality thin film having a desired thickness on the substrate to be processed. In this case, by repeating film formation of about one molecule or several molecules using surface reaction of the substrate to be processed, so that it is possible to perform high-quality film formation in comparison with a conventional CVD method including a gas phase reaction.

In this manner, in the substrate processing method according to the present embodiment, it is possible to promptly control the flow rate of the first process gas to be supplied to the substrate to be a desired value and to control the amount of the first process gas to be disposed of, thereby enabling efficient substrate processing.

In the above-mentioned embodiment, in consideration of response of the liquid mass flow controller 59A, even after step 1 is ended, the material 61a is continuously supplied to the vaporizer 62 at the flow rate F2 and the vaporized first process gas is supplied to the gas exhaust line 53A until the next step 1 is started.

In accordance with this, when step 1 is started, the liquid mass flow controller 59A is enabled to avoid stating the flow rate control from a set flow rate of 0 and to promptly control the flow rate of the material 61a to be the flow rate F1.

Further, by reducing the value of the flow rate F2 relative to the flow rate F1, the flow rate of the first process gas to be disposed of is reduced. For example, an area L shown in FIG. 9 indicates an effect of reduction of the first process gas according to the present embodiment.

In this case, preferably, the flow rate F2 is controlled to be not less than 5% of the maximum flow rate setting of the liquid mass flow controller 59A. In other words, the flow rate F2 is controlled to be not less than 5% of a value of the maximum flow rate setting of the mass flow controller 59A. In the following, the reason for this is described with reference to FIG. 2.

For example, when the flow rate of liquid is controlled using the liquid mass flow controller, the driving means 9A has a large driving force (driving range) in comparison with a case where the flow rate of gas is controlled. Accordingly, when the flow rate is controlled using the liquid mass flow controller, if the setting value is close to 0 or 0, a possibility that the diaphragm 9C may be pressed on the sheet portion 9D is increased in accordance with fluctuation of a control circuit or variation of environmental change such as temperature.

In this manner, once the diaphragm 9C is pressed on the sheet portion 9D, the diaphragm 9C is attached to the sheet portion 9D, so that even when control is performed so as to increase the flow rate again, a period of time for moving the diaphragm 9C to a position corresponding to the predetermined flow rate is increased.

A delay of response time resulting from such characteristics of the liquid mass flow controller has been problematic.

Figure 2:
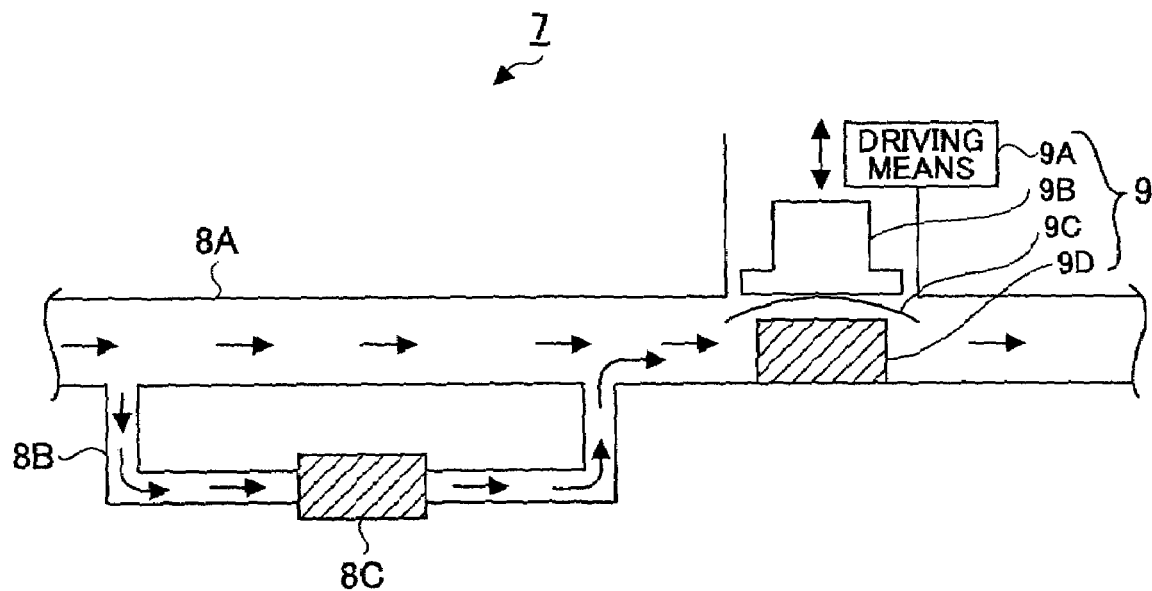
FIG. 2 is a diagram schematically showing a mass flow controller.

In view of this, in the present embodiment, the liquid mass flow controller is controlled so as to prevent the diaphragm 9C and the sheet portion 9D shown in FIG. 2 from being brought into contact.

In a case of a conventional liquid mass flow controller shown in FIG. 2, the flow rate actually controlled relative to the setting value has a predetermined margin of fluctuation and this may be regarded as positional accuracy of the diaphragm.

In the accuracy of a general liquid mass flow controller, the margin of fluctuation relative to the setting value is about 3% and an influence of shift of a reference point due to temperature is about 0.4%. The margin of fluctuation of the flow rate is considered to be 3.4% in total.

Accordingly, a position of the diaphragm 9C may be shifted downward as much as about 3.4%. In view of this, preferably, the flow rate F2 is set to not less than 5% of the maximum flow rate setting taking into consideration the margin so as to prevent the diaphragm 9C from being brought into contact with the sheet portion 9D, namely, so as to prevent operating delay of flow rate control.

Further, the driving means employs a piezo drive, solenoid drive, or the like. The driving means is designed for linear operation relative to input in the vicinity of a central portion of a flow rate control area so as to perform fastest operation. Accordingly, when the controlled flow rate is small (less than 10% of the maximum flow rate setting), flow rate controlling operation becomes slow.

Thus, in order to control a flow rate change from the flow rate F2 to the flow rate F1 and from the flow rate F1 to the flow rate F2 in a faster manner, preferably, the flow rate F2 is set to be not less than 10% of the maximum flow rate setting.

Moreover, in the same manner, when the flow rate setting of the mass flow controller is large, the driving means performs a nonlinear operation relative to input and the flow rate controlling operation may become slow. Accordingly, preferably, the flow rate F1 is set to be not more than 90% of the maximum flow rate setting.

Moreover, when flow rate F2 is set to be too large, a percentage of waste material is excessively increased. Accordingly, preferably, the flow rate for supplying the first process gas to the gas exhaust line 53A, namely, the flow rate F2 is set to be not more than 20% of the maximum flow rate setting in terms of cost reduction from reduced gas consumption.

Moreover, the flow rate F2 is regulated in accordance with the maximum flow rate setting of the liquid mass flow controller. Accordingly, preferably, a liquid mass flow controller having a maximum flow rate setting as small as possible is used so as to reduce the gas consumption.

Moreover, on the other hand, when time for substrate processing is reduced, namely, when each period of time for step 1 to step 4 is reduced, the flow rate control by the liquid mass flow controller 59A is required to perform in a faster manner. In this case, when a difference between the flow rate F2 and the flow rate F1 is large, a speed of the flow rate control by the liquid mass flow controller 59A may be insufficient. In this case, the flow rate F2 may be increased as appropriate. Further, when the flow rate F2 is increased, each period of time for step 1 to step 4 is reduced, so that an increase of gas consumption is offset.

In other words, the flow rate F2 may be determined in view of each period of time for step 1 to step 4, the speed of the flow rate controlled by the liquid mass flow controller 59A, and the effect of reduced gas consumption.

Moreover, in the above-mentioned embodiment, the amount of the first process gas to be exhausted is reduced, so that it is possible to reduce the formation of a by-product resulting from maxing of the first process gas with the second process gas on an exhaust side.

For example, on the installation side where the substrate processing apparatus is disposed, when the amount of the exhausted first process gas is large, the exhaust pipes for the first process gas and the second process gas may be separated or individual exhaust devices maybe required, so that a problem of an increase of cost may be occurred.

The substrate processing method according to the present invention reduces the amount of the first process gas to be exhausted, so that it is possible to reduce the formation of such a by-product and to reduce cost of disposing the substrate processing apparatus and maintenance.

Further, according to the present embodiment, in the substrate processing apparatus 10, mixing of the first process gas with the second process gas is reduced, so that it is possible to reduce the formation of such a by-product and the like. In the following, the reason for this is described.

For example, the when a gas containing $O_3$ is used for the second process gas, an ozonizer is used for generating $O_3$ in some cases. The ozonizer generates $O_3$ by discharging electricity using a discharge cell, so that time is required until concentration of $O_3$ becomes stable. Accordingly, preferably, the second process gas is continuously flown at a constant flow rate as much as possible in the sequence of substrate processing. Thus, preferably, while the generation of $O_3$ is continuously performed, the supply and stop of the second process gas to the process space is performed via the switching valve 52B. In this case, except in step 3, $O_3$ is exhausted from the gas exhaust line 53B via the trap 70. In this case, $O_3$ may be mixed with the first process gas exhausted from the gas exhaust line 53A connected to the trap 70 and a by-product may be formed.

However, in the present embodiment, the flow rate of the first process gas exhausted as mentioned above is reduced, so that the amount of the first process gas to be mixed with the second process gas on the exhaust side is reduced, so that the formation of a by-product is reduced.

Further, when $H_2O$, $O_2$, $N_2O$, or the like is used as the second process gas, it is possible to control the flow rate at a relatively high speed in comparison with the case where $O_3$ is used. Thus, it is possible to perform the supply and stop of the second process gas to the process space by opening and closing the valve 75B, the valve 60B, and the like.

However, at least in step 3, the second process gas is supplied to the process space A1, so that the second process gas is exhausted from the exhaust pipe 56B via the trap 70 in this step. Also in this case, in the substrate processing method according to the present embodiment, the amount of the first process gas to be exhausted from the gas exhaust line 53A is reduced, so that the mixing of the first process gas with the second process gas is reduced. Also in this case, preferably, control for reducing the flow rate F1 to the flow rate F2 is performed before step 3 is started so as to reduce the amount of the first process gas to be mixed. Based on the same reason, preferably, control for increasing the flow rate F2 to the flow rate F1 is performed after step 3 is ended.

Further, since the amount of the first process gas to be exhausted is reduced in this manner, it is possible to have a simple exhaust structure in which the gas exhaust lines 53A and 53B and the exhaust pipes 56A and 56B are connected via the trap and exhaust is performed collectively using the exhaust means 71.

The present invention is not limited to the specifically disclosed embodiment, and variations and modifications may be made without departing from the scope of the present invention.

INDUSTRIAL APPLICABILITY

According to the present invention, in substrate processing where plural process gases are alternately supplied on a substrate to be processed, the consumption of the process gas is reduced, so that efficient substrate processing is possible.

The present application is based on Japanese priority application No. 2005-081878 filed Mar. 22, 2005, the entire contents of which are hereby incorporated herein by reference.

The invention claimed is:

1. A substrate processing method using a substrate processing apparatus including:
   a process container holding a substrate to be processed therein;
   first gas supplying means having flow rate adjusting means for supplying a first process gas to said process container;
   gas switching means disposed between said process container and said gas supplying means, said gas switching means switching supplying directions of the first process gas to a first direction for supplying to said process container or to a second direction for supplying to a gas exhaust line; and
   second gas supplying means supplying a second process gas to said process container,
   said substrate processing method comprising:
   a first step of controlling a flow rate of the first process gas to be a first flow rate by said flow rate adjusting means and supplying the first process gas in the first direction;
   a second step of discharging the first process gas from said process container;
   a third step of supplying the second process gas to said process container; and
   a fourth step of discharging the second process gas from said process container, in a repeated manner, wherein
   a step of stabilizing the flow rate of the process gas is set between a primary first step and a secondary first step performed subsequently to said primary first step, and
   said step of stabilizing the flow rate of the process gas includes:
   a step (A) of switching the supplying directions to the second direction by said gas switching means after said primary first step;
   a step (B) of reducing the first flow rate to a second flow rate by said flow rate adjusting means after said step (A); and
   a step (C) of increasing the second flow rate to the first flow rate by said flow rate adjusting means after said step (B).

2. The substrate processing method according to claim 1, wherein
   the first process gas contains vaporized material made of a liquid material,
   said first gas supplying means has a vaporizer vaporizing the liquid material, and
   a flow rate of the liquid material to be supplied to said vaporizer is controlled by said flow rate adjusting means.

3. The substrate processing method according to claim 2, wherein
   the flow rate of the liquid material corresponding to the second flow rate is not less than 5% of a maximum flow rate setting of said flow rate adjusting means.

4. The substrate processing method according to claim 3, wherein
   the flow rate of the liquid material corresponding to the second flow rate is not less than 10% of the maximum flow rate setting of said flow rate adjusting means.

5. The substrate processing method according to claim 1, wherein
   said gas exhaust line is connected to a process container exhaust line disposed on said process container, said process container exhaust line exhausting said process container.

6. The substrate processing method according to claim 1, wherein
   said step (B) is performed before said third step is started.

7. The substrate processing method according to claim 6, wherein
   said step (C) is performed after said third step is ended.

8. The substrate processing method according to claim 2, wherein
   the liquid material contains a metallic element and the second process gas contains oxidation gas oxidizing the metallic element.

9. The substrate processing method according to claim 1, wherein
   said second step includes a purge step of supplying a purge gas to said process container.

10. The substrate processing method according to claim 1, wherein
    said fourth step includes a purge step of supplying a purge gas to said process container.

11. A computer-readable storage medium storing a computer-readable program which, when executed by a computer, causes the computer to perform a substrate processing method using a substrate processing apparatus including:
    a process container holding a substrate to be processed therein;
    first gas supplying means having flow rate adjusting means for supplying a first process gas to said process container;
    gas switching means disposed between said process container and said gas supplying means, said gas switching means switching supplying directions of the first process gas to a first direction for supplying to said process container or to a second direction for supplying to a gas exhaust line; and
    second gas supplying means supplying a second process gas to said process container,
    said substrate processing method comprising:
    a first step of controlling a flow rate of the first process gas to be a first flow rate by said flow rate adjusting means and supplying the first process gas in the first direction;
    a second step of discharging the first process gas from said process container;
    a third step of supplying the second process gas to said process container; and
    a fourth step of discharging the second process gas from said process container, in a repeated manner, wherein
    a step of stabilizing the flow rate of the process gas is set between a primary first step and a secondary first step performed subsequently to said primary first step, and
    said step of stabilizing the flow rate of the process gas includes:

a step (A) of switching the supplying directions to the second direction by said gas switching means after said primary first step;

a step (B) of reducing the first flow rate to a second flow rate by said flow rate adjusting means after said step (A); and a step (C) of increasing the second flow rate to the first flow rate by said flow rate adjusting means after said step (B).

12. The computer-readable storage medium according to claim 11, wherein the first process gas contains vaporized material made of a liquid material, said first gas supplying means has a vaporizer vaporizing the liquid material, and a flow rate of the liquid material to be supplied to said vaporizer is controlled by said flow rate adjusting means.

13. The computer-readable storage medium according to claim 12, wherein the flow rate of the liquid material corresponding to the second flow rate is not less than 5% of a maximum flow rate setting of said flow rate adjusting means.

14. The computer-readable storage medium according to claim 13, wherein the flow rate of the liquid material corresponding to the second flow rate is not less than 10% of the maximum flow rate setting of said flow rate adjusting means.

15. The computer-readable storage medium according to claim 11, wherein said gas exhaust line is connected to a process container exhaust line disposed on said process container, said process container exhaust line exhausting said process container.

16. The computer-readable storage medium according to claim 11, wherein said step (B) is performed before said third step is started.

17. The computer-readable storage medium according to claim 16, wherein said step (C) is performed after said third step is ended.

18. The computer-readable storage medium according to claim 12, wherein the liquid material contains a metallic element and the second process gas contains oxidation gas oxidizing the metallic element.

19. The computer-readable storage medium according to claim 11, wherein said second step includes a purge step of supplying a purge gas to said process container.

20. The computer-readable storage medium according to claim 11, wherein said fourth step includes a purge step of supplying a purge gas to said process container.

* * * * *